United States Patent
Lehner

(10) Patent No.: US 7,259,088 B2
(45) Date of Patent: Aug. 21, 2007

(54) APPARATUS FOR SINGULATING AND BONDING SEMICONDUCTOR CHIPS, AND METHOD FOR THE SAME

(75) Inventor: Rudolf Lehner, Laaber (DE)

(73) Assignee: Infineon Technologies AG, Neubiberg (DE)

( * ) Notice: Subject to any disclaimer, the term of this patent is extended or adjusted under 35 U.S.C. 154(b) by 88 days.

(21) Appl. No.: 11/245,440

(22) Filed: Oct. 7, 2005

(65) Prior Publication Data

US 2006/0065967 A1 Mar. 30, 2006

Related U.S. Application Data

(63) Continuation of application No. PCT/DE2005/000301, filed on Feb. 22, 2005.

(30) Foreign Application Priority Data

Feb. 26, 2004 (DE) .................... 10 2004 009 901

(51) Int. Cl.
*H01L 21/4763* (2006.01)
*B23K 31/02* (2006.01)
(52) U.S. Cl. .................... 438/618; 228/180.5
(58) Field of Classification Search ............... 257/696, 257/784, 735–738; 438/411, 461, 611–618; 228/4.5, 180
See application file for complete search history.

(56) References Cited

U.S. PATENT DOCUMENTS

| | | | |
|---|---|---|---|
| 4,010,885 A | 3/1977 | Keizer et al. | |
| 4,472,218 A | 9/1984 | Avedissian et al. | |
| 4,667,402 A | 5/1987 | Wilde | |
| 5,062,565 A | 11/1991 | Wood et al. | |
| 5,176,310 A * | 1/1993 | Akiyama et al. | 228/180.5 |
| 5,897,049 A | 4/1999 | Nakamura et al. | |
| 6,142,356 A | 11/2000 | Yamazaki et al. | |
| 6,467,678 B2 * | 10/2002 | Mochida et al. | 228/180.5 |

FOREIGN PATENT DOCUMENTS

| | | |
|---|---|---|
| JP | 62-005837 A | 1/1987 |
| WO | WO 03/089305 A1 | 10/2003 |

* cited by examiner

*Primary Examiner*—Calvin Lee
(74) *Attorney, Agent, or Firm*—Edell, Shapiro & Finnan, LLC

(57) ABSTRACT

An apparatus for singulating and bonding semiconductor chips includes a singulating station and a mounting station. In the singulating station, a semiconductor chip is provided with a bonding wire by a bonding tool and lifted off a carrier film. Then, in the mounting station, the semiconductor chip is placed on a chip mounting surface and fixed in place. The bonding wire is guided to a contact-connection surface of the circuit carrier and bonded to this surface.

10 Claims, 3 Drawing Sheets

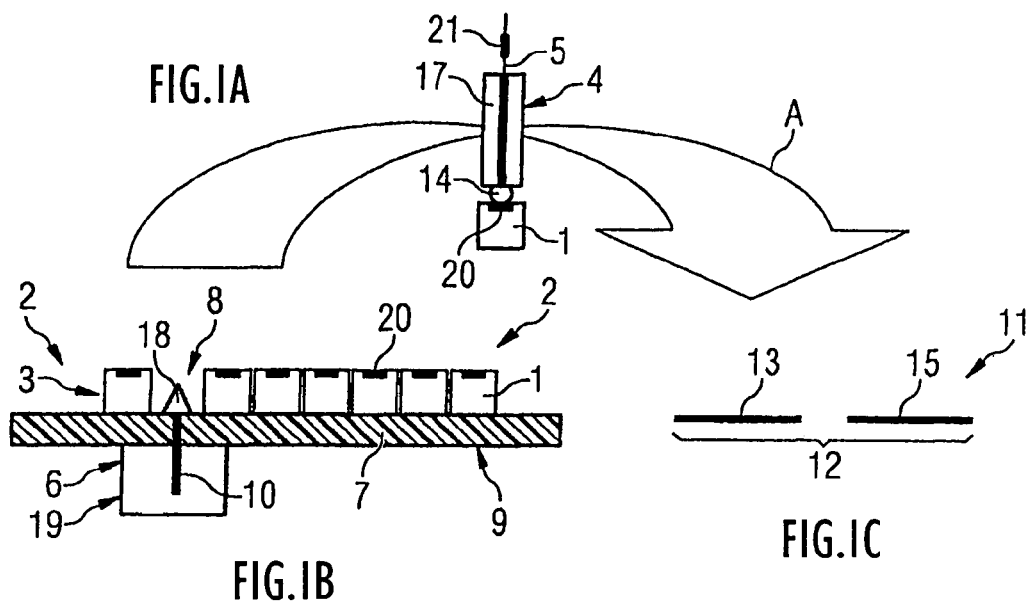
FIG.1A
FIG.1B
FIG.1C
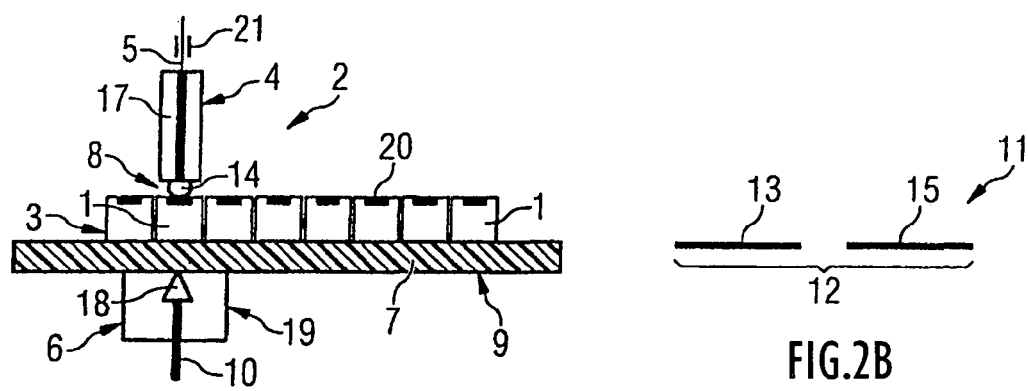
FIG.2A
FIG.2B
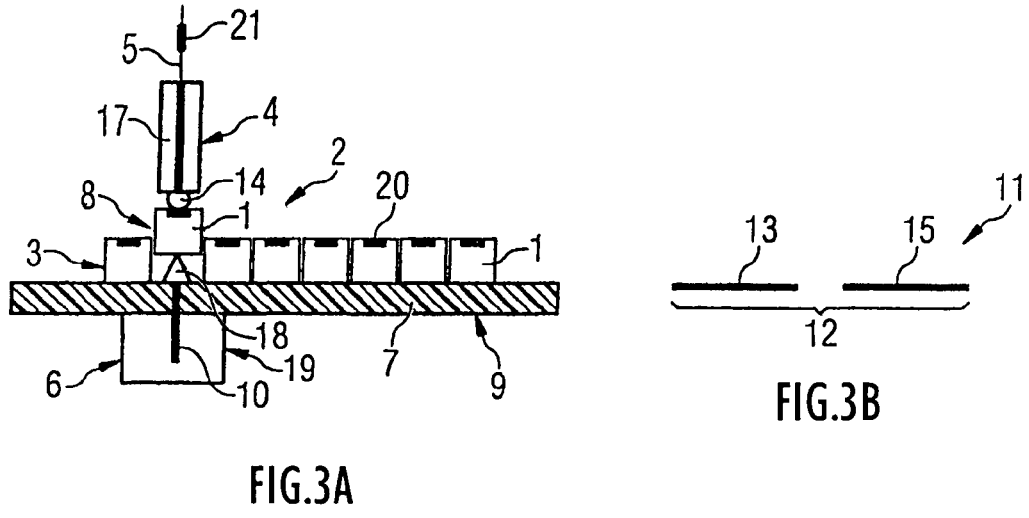
FIG.3A
FIG.3B

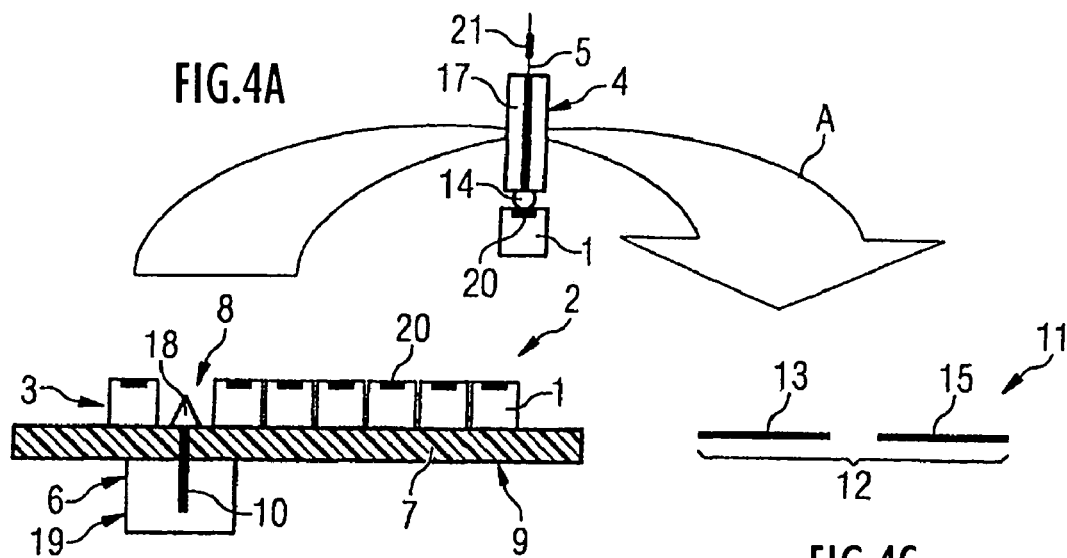
FIG.4A
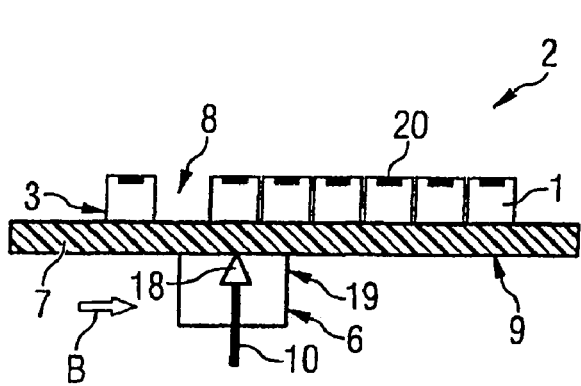
FIG.4B
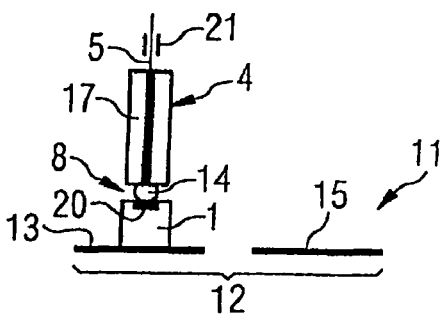
FIG.4C
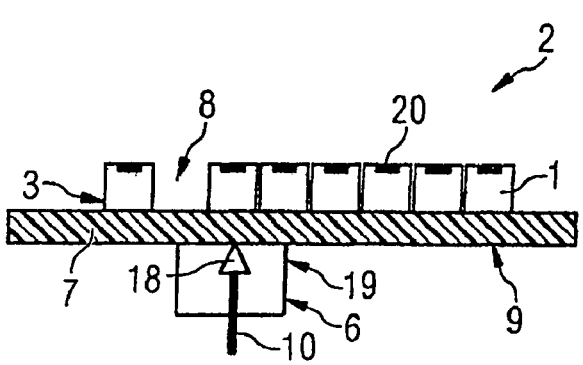
FIG.5A
FIG.5B
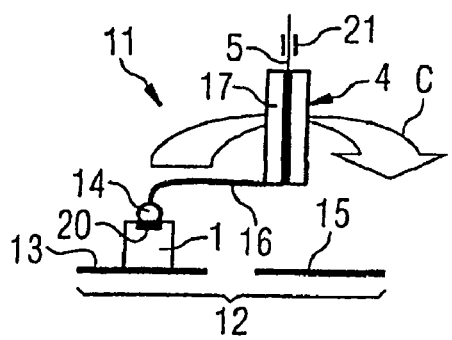
FIG.6A
FIG.6B

APPARATUS FOR SINGULATING AND BONDING SEMICONDUCTOR CHIPS, AND METHOD FOR THE SAME

CROSS REFERENCE TO RELATED APPLICATIONS

This application is a continuation of PCT/DE2005/000301, filed, Feb. 22, 2005, and titled "Apparatus for Singulating and Bonding Semiconductor Chips, and Method for Singulating and Bonding," which claims priority under 35 U.S.C. § 119 to German Application No. 10 2004 009 901.4, filed on Feb. 26, 2004, and titled "Apparatus for Singulating and Bonding Semiconductor Chips, and Method for Singulating and Bonding," the entire contents of which are hereby incorporated by reference.

FIELD OF THE INVENTION

This invention relates to an apparatus and a method for singulating and bonding semiconductor chips.

BACKGROUND

A system for producing semiconductor components provides a method for combining the semiconductor chip mounting method and the semiconductor chip wire bonding step when assembling a semiconductor housing. For this purpose, a conventional semiconductor chip mounting device and a semiconductor chip wire bonding device are integrated in a simplified, common machine system. A computer-monitored television camera system mounted independently observes and monitors the working steps of the semiconductor chip mounting process and the wire bonding process using feedback processes. A drawback is the use of a conventional singulating apparatus with a vacuum pipette, for example, as is known for large-area semiconductor chips. Vacuum pipettes of this type require a semiconductor chip to have a minimum surface area in order to be singulated, since otherwise the semiconductor chip cannot be picked up by the vacuum pipette and fed to a mounting station. Singulating and conveying of semiconductor chips with a surface area smaller than this minimum surface area is not possible.

However, there is a demand, in particular, in radiofrequency technology, to construct discrete RF semiconductor components, i.e., RF PIN diodes, in which the semiconductor chips are at least an order of magnitude smaller than the abovementioned minimum surface area required for semiconductor chips of this type to be handled in a singulating station of a semiconductor wafer divided into semiconductor chips.

An apparatus and a method which allow semiconductor chips with a surface area an order of magnitude smaller than the minimum surface area of semiconductor chips of conventional singulating apparatuses to be picked up and fed to a mounting device is desirable, for example, such that it is possible for radiofrequency semiconductor components and RF PIN diodes for radiofrequency applications to be installed in suitable radiofrequency housings at low cost.

SUMMARY

An apparatus for singulating and bonding semiconductor chips includes a singulating station, a mounting station, and a raising and conveying mechanism. For semiconductor chips of a semiconductor wafer, the singulating station is equipped with a bonding tool for fixing a bonding wire on a semiconductor chip. Furthermore, the singulating station includes a lift-off apparatus for lifting a semiconductor chip off a carrier film covered with semiconductor chips of a semiconductor wafer.

The bonding tool and the lift-off device are arranged opposite one another and oriented such that a semiconductor chip on a singulating table is arranged between the bonding tool and a raising device of the lift-off device. To direct the bonding tool and lift-off device onto a semiconductor chip, it is possible either to move the semiconductor wafer on the singulating table in the x and y directions or orthogonal to the direction of movement of the bonding tool and the raising device, or for the bonding tool and raising apparatus to be displaced in the x and y directions.

The mounting station includes a circuit carrier, which includes a chip mounting surface for receiving a semiconductor chip bonded to a bonding wire of the bonding tool. Furthermore, the circuit carrier in the mounting station includes at least one contact-connection surface for the bonding wire of the bonding tool to be bonded onto this contact-connection surface. Finally, the apparatus according to the invention has a raising and conveying mechanism with a control apparatus for controlling and executing movements of the bonding tool, the singulating table, the lift-off device and the circuit carrier.

The minimum surface area for a semiconductor chip that can be bonded, singulated, and conveyed using this apparatus is reduced by more than an order of magnitude compared to conventional singulating apparatuses. Since the diameter of the bonding wires is reduced to 15 micrometers in accordance with the current state of the art, the minimum surface area is reduced to a contact surface area of approximately 35×35 micrometers, which is required to pick up and convey a semiconductor chip. If a sawing interval for the saw tracks is included in the calculation, to ensure that microcracks cannot propagate into the active area of the semiconductor chip, the external dimensions of a semiconductor chip of this type, which can still be processed using this apparatus according to the invention, have an edge length of approximately 70 micrometers.

Minimum dimensions of this size, for example, with discrete radiofrequency semiconductor components, such as RF PIN diodes, are separated using the installation according to the invention, and at the same time thermocompression heads are attached to the top side of the semiconductor chip to one of the contact surfaces of this top side. The bonding wire, which subsequently relatively simultaneously electrically connects the semiconductor chip on a circuit carrier to a higher-level printed-circuit board during the singulating operation, lifts the semiconductor chip out of its position on the singulating table. For this purpose, the bonding tool may have a central bonding capillary or a central hollow stylus in which a bonding wire is arranged. In the bonding tool, a clamping apparatus is installed above the bonding capillary or bonding stylus, which clamping apparatus, in its open position, allows the bonding wire to be advanced through the bonding capillary, and in the clamped position fixes the bonding wire in the capillary at a defined length.

The bonding tool also includes a melting device, which melts the bonding wire at its free end projecting out of the capillary to form a bonding bead. This melting device can include a flame generator or a spark generator that melts the bonding wire and forms a bonding bead. Other embodiments of the melting device provide for induction coils that heat the bonding wire until the bonding wire melts and forms a bonding bead.

The bonding tool is displaceable in the vertical direction above the separating table. This means that during bonding to a contact surface of the active top side of the semiconductor chip, the bonding tool is lowered in the vertical z direction onto a semiconductor chip, after the bonding tool has been aligned in the x and y directions, and then the bonding operation is carried out. For this purpose, an ultrasound-assisted thermocompression bonding step bonds the bonding bead to the metal of the contact surface. Furthermore, eutectic bonds, which, after the bonding operation, have a high resistance to detachment that the semiconductor chip can be lifted off the carrier film suspended from the bonding wire, are produced. However, the adhesion forces of this carrier film are usually so high that there is a risk of the thin bonding wire breaking.

Therefore, in a further exemplary embodiment of the invention, the lift-off device is arranged below the film and includes a raising needle which is directed onto the semiconductor chip to be lifted off. After the bonding operation, this raising needle can punctures the carrier film and lifts the semiconductor chip off the carrier film, while the semiconductor chip is suspended from the bonding tool. To facilitate release from the carrier film, the lift-off apparatus includes a heating apparatus directed onto the carrier film in the region of the semiconductor chip to be lifted off. This variant is used, for example, in- situations in which the carrier film includes a layer of thermoplastic adhesive that melts under the action of heat from the heating apparatus.

The lift-off device, for example, includes both a heating apparatus and a raising needle, in order to make it easier to lift the chip off the carrier film. Furthermore, the underside of the semiconductor chip remains wet with a thermoplastic, when the semiconductor chip is lifted off, which facilitates placing of the semiconductor chip and mounting of the semiconductor chip on a circuit carrier in a mounting station. The mounting station includes exchangeable holders for different circuit carrier designs. For example, each circuit carrier, as mentioned above, includes a chip mounting surface, on which the chip suspended from the bonding wire can be mounted. Furthermore, the circuit carrier includes at least one contact surface, which is electrically isolated from the chip mounting surface, the electrical connection to the semiconductor chip then being created via the bonding wire with the aid of the bonding tool. The exchangeable holder may include a leadframe as circuit carrier, in which case a chip island forms the chip mounting surface and an internal flat conductor includes the contact-connection surface.

In a further exemplary embodiment of the invention, the mounting station includes a holder for a panel. The panel used as a circuit carrier has a plurality of component positions, arranged in rows and columns. Each has a semiconductor chip surface and corresponding contact-connection surfaces in the semiconductor component positions.

Furthermore, the mounting station includes a holder for a rewiring substrate, which is available as circuit carrier for a semiconductor chip to be mounted on.

A rewiring substrate, unlike a self-supporting, metallic leadframe, has a supporting structure made from plastic or ceramic. On its top side, this rewiring substrate has metallic rewiring structures in the form of a thin metal layer, which has been patterned to form a bonding island or contact-connection surfaces. For chip mounting of rewiring substrates of this type, the holder for the circuit carrier is exchanged in the apparatus according to the invention.

In particular, the apparatus in the mounting station includes a holder for a radiofrequency housing, which as circuit carrier can have a semiconductor chip mounted on it. This radiofrequency housing may be a radiofrequency PIN diode housing formed of metal structures and ceramic insulating components. The cathode terminal is, for example, formed by the chip mounting surface and the anode terminal is formed by the contact-connection surface.

A method for singulating and bonding semiconductor chips of a semiconductor wafer that has been divided into semiconductor chips includes the following method steps. A semiconductor wafer, which has been attached to a carrier film and divided into semiconductor chips, is positioned on a singulating table of a singulating station. Then, a bonding tool is aligned with a bonding wire above the semiconductor chip on the singulating table. Then, a bonding bead is formed at the end of the bonding wire by a melting device, and the bonding tool is lowered in the direction of the semiconductor chip. In the process, the bonding bead is bonded onto a contact surface of the semiconductor chip.

Then, the bonding tool with the semiconductor chip suspended from the bonding wire is lifted off the carrier film. This lift-off step is assisted by a lift-off apparatus arranged below the separating table. For this purpose, below the carrier film, the lift-off apparatus includes a raising needle that punctures the carrier film in order to assist with lifting off the semiconductor chip. Furthermore, in the region of the semiconductor chip to be lifted off, the lift-off device has a heating apparatus below the carrier film, which heats the carrier film and therefore the adhesion layer on the carrier film in the region of the semiconductor chip to be lifted off, which makes it easier to lift off the semiconductor chip suspended from the bonding wire.

Then, the semiconductor chip is conveyed on the bonding wire of the bonding tool to a mounting station, which includes a circuit carrier with a chip mounting surface and at least one contact-connection surface. By lowering the bonding tool, the semiconductor chip on the bonding wire is placed on the mounting surface and fixed to it. Finally, by opening the clamping device of the bonding tool, the bonding wire is released and guided in the form of a bonding clip onto the contact-connection surface with the aid of the bonding tool. The bonding clip is then attached to the contact-connection surface by thermocompression bonding, which may be assisted by ultrasound, and by closing the clamping device of the bonding tool, the wire is torn away from the bonding location and broken off.

This method can be repeated until the semiconductor chips of the semiconductor wafer in the separating position have been separated from the carrier film and applied to corresponding circuit carriers in the mounting station, where the semiconductor chips are electrically connected to corresponding contact-connection surfaces via bonding wires. In the case of discrete component production, the semiconductor chip is introduced into a hollow ceramic housing during the mounting operation, or alternatively, embedded in a plastic potting compound after the mounting operation. The respective circuit carrier may have external contacts, to which the chip mounting surface and the contact-connection surface are connected via outer contact surfaces of the semiconductor component.

On the other hand, using a leadframe strip, this mounting operation is initially carried out on the entire leadframe strip, and then a suitable packaging method is carried out, in which the bonded semiconductor chips are embedded in housings. If the semiconductor chips are applied to panels or a ceramic plate, the semiconductor positions of a panel or ceramic plate are provided with corresponding semiconductor chips in succession, and after a common plastic or ceramic covering has been applied, the panel or ceramic plate can be separated into individual components.

In an exemplary embodiment of the method, prior to positioning the semiconductor wafer, the semiconductor wafer is divided into semiconductor chips on the singulating table by diamond sawing. Thus, there is no need for the semiconductor chip to be adhesively bonded to its carrier film by the singulating table and then have the bonding released again. In this case, the singulating table serves simultaneously as the sawing table. Therefore, the table is conveyed from a sawing position to the singulating station of the present apparatus without the semiconductor wafer being removed from its carrier film.

To enable the method cycle of the apparatus according to the invention to be carried out, at the start of the method, before the bonding tool is aligned above one of the semiconductor chips on the singulating table, a bonding wire is introduced into a central bonding capillary of the bonding tool. This bonding capillary is, for example, a bonding stylus, which is specially shaped at its tip in order, for example, to produce a bonding clip.

A flame or an ignition spark is, for example, directed onto the end of a bonding wire to form a bonding bead at the bonding wire end. In this case, sufficient energy is transferred for a virtually spherical bonding bead to be formed. When continuing the method, the bonding bead is formed by inductive heating.

Attaching the semiconductor chip on the chip mounting surface in the mounting station of the apparatus may be carried out by pressing the bonding tool with the semiconductor chip at its tip onto a layer of adhesive on the chip mounting surface, in which case force is transmitted from the bonding tool to the semiconductor chip via the thermocompression head of the bonding wire. A further variant provides for a layer of solder on the chip mounting surface to be heated, and at the same time the semiconductor chip to be pressed onto the molten layer of solder with the aid of the bonding tool, in order to attach the semiconductor chip on the chip mounting surface by the bonding tool.

In conventional apparatuses, there is a problem with carrying out the mounting process with small semiconductor chips at edge lengths of less than a millimeter. This problem is that the conventional vacuum pipettes, due to the small dimensions of their vacuum capillaries, only have short service lives, and consequently the costs of the method for mounting small semiconductor chips on circuit carriers increase exponentially with the decrease in the surface area of semiconductor chips.

Furthermore, there is a technical limit on the size of these bonding tools with a vacuum bore, since the vacuum bore has to have a minimum diameter of approximately 100 micrometers, which is necessary to convey the semiconductor chip from the separating position to a mounting station. Since the bore is in the region of 100 micrometers, the limit for the minimum external diameter of the vacuum pipette is approximately 200 micrometers. Consequently, semiconductor chips with an edge length of less than 200 micrometers can no longer be processed using conventional separating and mounting installations.

The service lives for relatively small vacuum pipettes, which permit an edge length of 150 micrometers, are so short that these vacuum pipettes cannot even complete the processing of a single semiconductor wafer with a diameter of 30 cm, which has been divided into semiconductor chips, since the service life of such fine vacuum pipettes is less than 10 000 chips per pipette, and a semiconductor wafer of this type includes several hundred thousand semiconductor chips. In the present invention, the function of the vacuum pipettes is taken on by a bonding tool, tools of this type being able to apply bonding wires with a diameter of 15 micrometers to contact-connection surfaces with an edge length of a few tens of micrometers.

It is therefore now possible to further advance the miniaturization of discrete semiconductor components, such as RF PIN diodes for radiofrequency technology, and the miniaturization of semiconductor components for radiofrequency technology, especially since the minimum surface area required of the semiconductor chips for separating and bonding can be reduced by at least an order of magnitude by the apparatus according to the invention. During the separating operation, the semiconductor chip is suspended by its contact surface. The contact surface is bonded to the bonding wire by a thermocompression head. Consequently, the semiconductor chip can be reliably conveyed to the circuit substrate in the mounting station, where the semiconductor chip can be mounted on a corresponding chip mounting surface. In this case, the bonding wire or the thermocompression head already on the semiconductor chip can serve as a buffer between the bonding tool and the semiconductor chip. To conclude the method according to the invention, the bonding wire is bonded to the available contact-connection surface, for example, of an internal flat conductor of a leadframe.

Since conventional technology can neither separate such small semiconductor chips nor bond them to a circuit substrate, it is possible to prove that competitors are using the idea of the invention by measuring the semiconductor chip sizes. Furthermore, a deformation of the thermocompression head indicates a dual action of the bonding tool on the thermocompression head, on which the method according to the invention is based.

BRIEF DESCRIPTION OF THE DRAWINGS

The invention will now be explained in more detail based on the appended figures.

FIGS. 1A-1C illustrate an apparatus for singulating and bonding semiconductor chips according to an embodiment of the invention;

FIGS. 2A and 2B illustrate a first step of a method for singulating and bonding semiconductor chips;

FIGS. 3A and 3B illustrate a second step of the method for singulating and bonding semiconductor chips;

FIGS. 4A-4C illustrate a third step of the method for singulating and bonding;

FIGS. 5A and 5B illustrate a fourth step of the method for singulating and bonding;

FIGS. 6A and 6B illustrate a fifth step of the method for singulating and bonding;

DETAILED DESCRIPTION

Figure 7A:
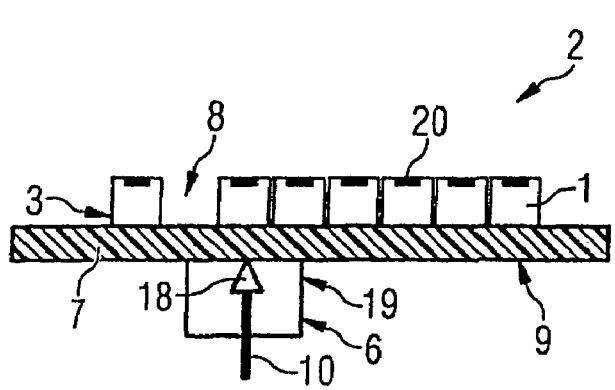
FIGS. 7A and 7B illustrate a sixth step of the method for singulating and bonding.

FIGS. 1A-1C illustrate an apparatus for singulating and bonding semiconductor chips 1 according to an embodiment of the invention. The apparatus includes two stations, a singulating station 2 and a mounting station 11. A bonding tool 4 is moved back and forth between these two stations. The bonding tool 4 picks up a semiconductor chip 1 by bonding the semiconductor chip 1 in the singulating station 2 and conveys the semiconductor chip 1 to the mounting station 11.

A bonding tool 4 of this type includes a bonding capillary 17 or bonding stylus, in which capillary or next to which stylus a bonding wire 5 is guided. In the singulating station 2, this bonding tool 4 can be directed onto a semiconductor chip position 8 of a semiconductor wafer 3 divided into semiconductor chips 1, so that the bonding tool 4 is arranged in the singulating station 2 immediately above the semiconductor chip position 8.

The semiconductor wafer 3 with its semiconductor chips 1 is fixed or arranged on a carrier system, such as a carrier film 7, which is arranged on a singulating table 9. A lift-off device 6 is arranged beneath the carrier film 7 opposite the semiconductor chip position 8. The lift-off device 6 includes a raising device 10 with or without a raising needle 18. The raising device may also be heated in order to make it easier to lift off the semiconductor chip. The singulating table 9 is arranged between the lift-off device 6 and the bonding tool 4 arranged opposite it in the singulating station 2.

After a bonding bead 14 has formed at the end of the bonding wire 5, as occurs in the ball-wedge process, the bonding tool 4 moves a semiconductor chip 1 from the singulating table 9 into the mounting station 11 with the aid of its bonding wire 5 and a clamping apparatus 21 for the bonding wire 5, in the direction indicated by arrow A. Lifting the semiconductor chip 1 off the carrier film 9 or a leadframe, in this embodiment of the invention, is facilitated by a heating apparatus 19 of the lift-off device 6 in the region of the semiconductor chip 1 to be lifted off. This heating apparatus 19 reduces the work which the raising device 10 with its raising needle 18 has to perform to release the chip, so that the semiconductor chip 1 can be removed from the carrier film 7 without problems.

The mounting station 11 includes a holder (not shown) that holds a circuit carrier 12 with a chip mounting surface 13 and at least one contact-connection surface 15.

As soon as the semiconductor chip 1 suspended from the bonding wire 5 has been moved onto the chip mounting surface 13 of the mounting station 11 by the movement of the bonding tool 4 in the direction of arrow A, the semiconductor chip 1 is bonded to the chip mounting surface 13 using a very wide range of measures. For this purpose, the chip mounting surface 13 has, for example, a layer of adhesive or a bondable or solderable coating. The rear side of the semiconductor chip 1 is secured to the chip mounting surface 13, for example, by forming a eutectic melt or by forming a solder melt, by thermocompression bonding.

Since the bonding wire 5 in the bonding capillary 17 or bonding stylus is already bonded to the semiconductor chip 1 on its contact surface 20, after the semiconductor chip 1 has been attached to the chip mounting surface 13, the bonding wire 5 is pulled over to the contact-connection surface 15 and in this way, the bonding connection is completed. This cycle can be repeated until the functioning semiconductor chips 1 of the semiconductor wafer 3 have been moved from the singulating station 2 to the mounting station 11 and fully bonded there.

In extreme circumstances, this apparatus reduces the minimum surface areas required for conveying from a singulating station 2 to a mounting station 11 at least by an order of magnitude compared to the conventional apparatuses. The initial bonding of a bonding wire 5 to a semiconductor chip 1 on the at least one contact surface 20 takes place during the separating operation. The combination of dividing the bonding steps into a first bonding step, which is simultaneously combined with a singulating step for singulating semiconductor chips 1 of a semiconductor wafer 3, with the second bonding point being shifted into the mounting station 11 creates an initial possibility of reliably bonding semiconductor chips 1 with minimal edge dimensions in a mounting station 11 and lifting them off a carrier film 7 in a singulating station 2.

FIGS. 2A to 8B illustrate steps for using the apparatus according to the invention, as shown in FIGS. 1A-1C, for the cycle for singulating and bonding a first semiconductor chip 1. This cycle illustrated in FIGS. 2A to 8B can be repeated any desired number of times, until the semiconductor chips 1 of a semiconductor wafer 3 have been processed. Components which have the same functions as in FIGS. 1A-1C are denoted by the same reference designations as in FIGS. 2A to 8B and are not explained again.

FIGS. 2A and 2B illustrate a first step of a method for singulating and bonding a semiconductor chip 1 of a semiconductor wafer 3 divided into semiconductor chips 1. At the start of the method according to the invention, the bonding wire 5 is introduced into the bonding capillary 17 with the clamping apparatus 21 open. That end of the bonding wire 5 that projects out of the bonding capillary 17 is converted into a bonding bead 14 by being melted even before the bonding wire 5 is placed onto a semiconductor chip 1.

When the bonding capillary 17 is placed onto a contact surface 20 of a semiconductor chip 1 in the semiconductor component position 8, the bonding bead 14 is converted into a thermocompression head by thermocompression and ultrasound, and at the same time the material of the bonding wire 5 is fused to the material of the contact surface 20. In this case, the energy is partially applied by frictional energy resulting from ultrasonic movements and partially by the supply of heat and finally by the pressure with which the bonding bead 14 is pressed onto the contact-connection surface 15.

In this exemplary embodiment, the contact surface 20 includes an aluminum alloy and the bonding wire 5 includes gold, aluminum, or alloys thereof, so that during the thermocompression bonding, a eutectic melt is formed even at low temperature and the two boundary surfaces are soldered together. Consequently, a state in which the semiconductor chip 1 is securely bonded to the bonding wire 5 via the contact surface 20 is achieved in the singulating station 2 as shown in FIGS. 2A and 2B. To ensure that this bond between bonding wire 5 and semiconductor chip 1 does not become delaminated or break off when the semiconductor chip 1 is being lifted off, a lift-off device 6, which can perform a number of functions, is fitted below the singulating table 9.

The region in the vicinity of the semiconductor chip position 8 is heated with the aid of a heating apparatus 19, in order to liquefy or vitrify the adhesion layer between carrier film 7 and semiconductor chip 1. Furthermore, this lift-off device 6 includes a raising device 10, which in its tip has a raising needle 18 which punctures the carrier film 7 and lifts the semiconductor chip 1 secured to the bonding wire 5 off the carrier film 7. At the same time, for this lift-off operation, the clamping apparatus 21, which is shown still open in FIGS. 2A and 2B, is closed, as shown in FIGS. 3A and 3B.

FIGS. 3A and 3B illustrate a second step of the method for singulating and bonding in accordance with an embodiment of the invention. The raising needle 18 has now punctured the carrier substrate in the singulating station 2 and lifted the semiconductor chip 1 off the adhesive layer of the carrier film 7 sufficiently far for the bonding tool 4 now to be able to singulate the semiconductor chip 1 from the semiconductor wafer 3 at its contact surface 20.

FIGS. 4A-4C illustrate a third step of a method for singulating and bonding semiconductor chips 1. FIGS. 4A-4C corresponds to FIGS. 1A-1C and shows a state in which the bonding tool 4 has already reached an intermediate position between the singulating station 2 and the mounting station 11. In this state, the clamping apparatus 21 is closed, as in FIGS. 3A and 3B, and is therefore holding the semiconductor chip 1 securely on the bonding wire 5, so that the semiconductor chip 1 cannot drop off while being conveyed from the singulating station 2 to the mounting station 11.

FIGS. 5A and 5B illustrate a fourth step of a method for singulating and bonding, in which the bonding tool 4 has already reached the mounting station 11 and has lowered the semiconductor chip 1 onto the chip mounting surface 13 of the circuit carrier 12. The clamping apparatus 21 is opened and releases the bonding wire 5, so that renewed bonding can take place. During this thermocompression bonding, the rear side of the semiconductor chip 1 is fixed on the chip mounting surface 13 of the circuit carrier 12, for example, by thermocompression bonding. At the same time, the lift-off device 6 has advanced one position in the singulating station 2, in the direction indicated by arrow B, preparatory to the next bonding cycle.

FIGS. 6A and 6B illustrate a fifth step of the method for singulating and bonding. The clamping apparatus 21 at the bonding tool 4 is open, so that the bonding capillary 17 at the chip mounting surface 13 can be moved to the contact-connection surface 15 to form a bonding clip 16 in the direction indicated by arrow C without the bonding wire 5 breaking. The situation in the singulating station 2 remains unchanged during this operation.

Figure 7B:
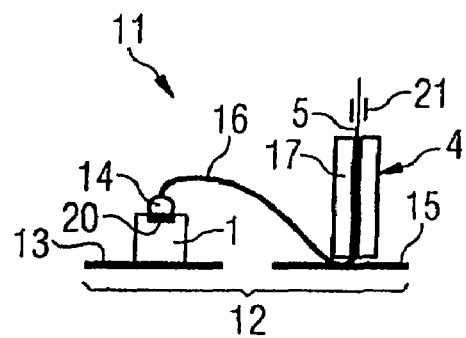

FIGS. 7A and 7B illustrate a sixth step of the method for singulating and bonding. In this sixth step, the end of the bonding wire 5 is secured to the contact-connection surface 15 by a thermocompression operation, which is subject to ultrasound. Immediately after this, the clamping apparatus 21 can be closed, as shown in FIGS. 8A and 8B.

Figure 8A:
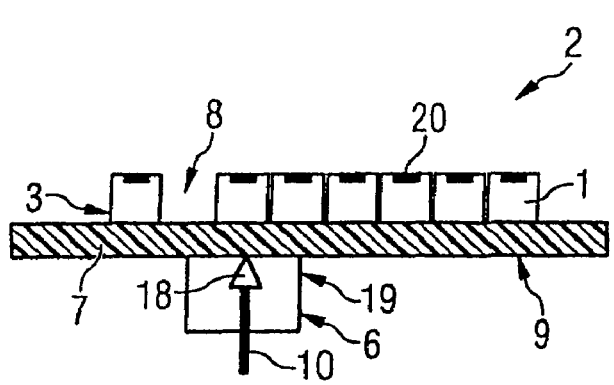
FIGS. 8A and 8B illustrate a seventh step of the method for singulating and bonding.
Figure 8B:
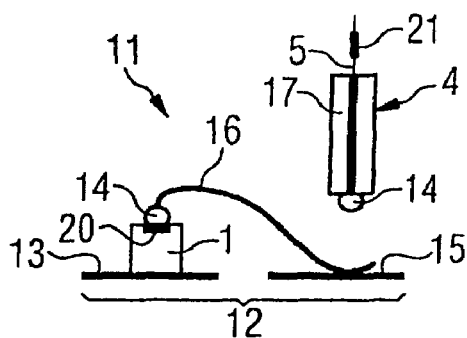

FIGS. 8A and 8B illustrate a seventh step of the method. In this seventh step, the bonding tool 4 severs the bonding wire 5 of the bonding clip 16. For this purpose, the clamping apparatus 21 is closed. An ignition spark is directed onto the bonding wire 5 and the bonding wire 5 is separated, forming a bonding bead 14. This prepares the bonding tool 4 for singulating the next semiconductor chip 1 from the carrier film 7, as shown in FIGS. 2A and 2B. This cycle is continued until the functioning semiconductor chips 1 have been singulated from the carrier film 7 and bonded to a circuit carrier 12 in the mounting station 11.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for singulating and bonding semiconductor chips of a semiconductor wafer divided into semiconductor chips, the method:

positioning a semiconductor wafer disposed on a carrier film and divided into semiconductor chips on a singulating table of a singulating station;

aligning a bonding tool with bonding wire above one of the semiconductor chips on the singulating table;

forming a bonding bead at an end of the bonding wire;

lowering the bonding tool onto the semiconductor chip to bond the bonding bead onto a contact surface of the semiconductor chip;

lifting the bonding tool with semiconductor chip suspended from the bonding wire off the carrier film;

conveying the semiconductor chip on the bonding wire of the bonding tool to a mounting station, the mounting station including a circuit carrier with a chip mounting surface and at least one contact-connection surface;

attaching the semiconductor chip on the chip mounting surface by the bonding tool;

guiding the bonding wire by the bonding tool from the contact surface of the semiconductor chip to the contact-connection surface; and bonding the bonding wire on the contact-connection surface.

2. The method according to claim 1, wherein prior to positioning the semiconductor wafer, singulation of the semiconductor wafer into semiconductor chips is carried out on the singulating table by diamond sawing or laser beam separation.

3. The method according to claim 1, wherein prior to aligning the bonding tool above one of the semiconductor chips on the singulating table, a bonding wire is introduced into a central bonding capillary of the bonding tool or next to a bonding stylus.

4. The method according to claim 1, wherein a flame or an ignition spark is directed onto the end of the bonding wire to form a bonding bead at the bonding wire end.

5. The method according to claim 1, wherein inductive heating is carried out to form a bonding bead at the end of the bonding wire.

6. The method according to claim 1, wherein thermocompression sonic bonding is carried out to bond the bonding bead onto a contact surface of the semiconductor chip.

7. The method according to claim 1, wherein prior to lifting the bonding tool with semiconductor chip suspended from the bonding wire off the carrier film, the carrier film is heated in the region of the semiconductor chip.

8. The method according to claim 1, wherein to attach the semiconductor chip on the chip mounting surface by the bonding tool, the semiconductor chip is pressed onto a layer of adhesive on the chip mounting surface.

9. The method according to claim 1, wherein to attach the semiconductor chip on the chip mounting surface by the bonding tool, a layer of solder on the chip mounting surface is heated and the semiconductor chip is pressed onto the molten layer of solder or the molten eutectic layer.

10. The method according to claim 1, wherein bonding of the bonding wire on the contact-connection surface is carried out by thermocompression sonic bonding of a bonding clip on the contact-connection surface.

* * * * *